United States Patent [19]

Greene et al.

[11] Patent Number: 5,805,460
[45] Date of Patent: Sep. 8, 1998

[54] METHOD FOR MEASURING RF PULSE RISE TIME, FALL TIME AND PULSE WIDTH

[75] Inventors: Elliott J. Greene, Union; Pei-Hwa Lo, Ramsey, both of N.J.

[73] Assignee: AlliedSignal Inc., Morristown, N.J.

[21] Appl. No.: 874,001

[22] Filed: Jun. 13, 1997

Related U.S. Application Data

[63] Continuation of Ser. No. 327,076, Oct. 21, 1994, abandoned.

[51] Int. Cl.$^6$ ................................................ G01R 29/02
[52] U.S. Cl. ........................ 364/486; 364/487; 364/569; 327/14; 327/31
[58] Field of Search ..................... 364/486, 487, 364/569; 324/617; 327/14, 31; 368/118

[56] References Cited

U.S. PATENT DOCUMENTS

| | | | |
|---|---|---|---|
| 3,524,201 | 8/1970 | Land, Jr. | 343/6.8 |
| 3,706,095 | 12/1972 | Cherwek | 343/7.7 |
| 3,735,261 | 5/1973 | Vahlstrom et al. | 327/14 |
| 3,758,763 | 9/1973 | Nohara et al. | 235/151.31 |
| 3,845,482 | 10/1974 | Jirousek et al. | 343/18 |
| 4,045,797 | 8/1977 | Krage | 348/8 |
| 4,121,211 | 10/1978 | Cusack | 343/14 |
| 4,223,267 | 9/1980 | Sartorius et al. | 368/118 |
| 4,282,524 | 8/1981 | Eymann et al. | 343/14 |
| 4,291,269 | 9/1981 | Nossen | 324/79 |
| 4,324,258 | 4/1982 | Huebscher et al. | 128/663 |
| 4,412,219 | 10/1983 | Briggs et al. | 343/6.8 |
| 4,424,482 | 1/1984 | Drogin | 324/79 |
| 4,562,549 | 12/1985 | Tanaka et al. | 364/486 |
| 4,611,165 | 9/1986 | Nussbaum | 324/77 |
| 4,799,020 | 1/1989 | English | 324/79 |
| 4,845,685 | 7/1989 | Wechsler et al. | 367/97 |
| 4,853,944 | 8/1989 | Lo et al. | 375/323 |
| 4,858,142 | 8/1989 | Jenq et al. | 324/487 |
| 4,904,947 | 2/1990 | Olivenbaum et al. | 368/118 |
| 4,944,189 | 7/1990 | Nakajima et al. | 73/861.25 |
| 4,979,215 | 12/1990 | Fontanes et al. | 381/49 |
| 5,038,096 | 8/1991 | Obie et al. | 324/77 |
| 5,121,413 | 6/1992 | Voegtly et al. | 375/95 |
| 5,194,818 | 3/1993 | Scheibner | 324/617 |
| 5,222,028 | 6/1993 | LaBarre et al. | 364/486 |
| 5,262,714 | 11/1993 | Friedman | 324/76.42 |
| 5,269,308 | 12/1993 | Hagiwara et al. | 128/661.09 |
| 5,301,210 | 4/1994 | Vandamme et al. | 375/83 |
| 5,329,253 | 7/1994 | Ichihara | 331/17 |
| 5,373,236 | 12/1994 | Tsui et al. | 324/76.42 |
| 5,508,605 | 4/1996 | Lo et al. | 324/76.42 |
| 5,592,390 | 1/1997 | Liken et al. | 364/487 |

FOREIGN PATENT DOCUMENTS

| | | |
|---|---|---|
| 1239286 | 7/1971 | United Kingdom . |
| WO93/03398 | 2/1993 | WIPO . |

OTHER PUBLICATIONS

David A. Bell, *Solid State Pulse Circuits*, Reston Publishing Co. Inc. a Prentice–Hall Company, 1981, pp. 1–27.

*Primary Examiner*—Emanuel T. Voeltz
*Assistant Examiner*—Eric W. Stamber
*Attorney, Agent, or Firm*—Verne E. Kreger, Jr.

[57] ABSTRACT

A method for measuring the rise/fall time and pulse width of RF pulses using multi-purpose, commercial-off-the-shelf test devices, such as an RF signal down converter, a digitizer and a signal processor. The method is based on digitizing the RF signals and developing an average sample pulse waveform. The rise/fall time and pulse width are then calculated from data points on the sample waveform. The method is suitable for real-time calculations of the rise/fall time and pulse width.

4 Claims, 3 Drawing Sheets

METHOD FOR MEASURING RF PULSE RISE TIME, FALL TIME AND PULSE WIDTH

This is a continuation of application Ser. No. 08/327,076 filed Oct. 21, 1994, now abandoned.

BACKGROUND OF THE INVENTION a. Field of the Invention

The present invention relates to pulse RF signals, and more particularly to an inexpensive method of measuring the rise time, fall time and pulse width of pulse RF signals in real-time or near real-time.

b. Description of Related Art

Radar and electronic counter measure (ECM) systems commonly employ pulse RF signals with narrow pulse widths and low duty cycles. Such pulses typically are generated by on/off switching (e.g. using a pin switch diode) of a continuous RF source, and can be extremely short in duration (100 nanoseconds). The rise and fall time and pulse width of the RF pulses emitted by these systems are important characteristics that must be accurately measured to assess a system's performance.

The conventional tool for measuring these parameters is an RF pulse detector. These instruments, however, require a digital pulse to perform these measurements and cannot operate on RF pulses directly. Furthermore, the implementation of RF pulse detectors for fast rise/fall times (10 nanosec) is expensive and requires specialized hardware. Also, the pulse parameters measured from the output of the detector are a composition of true time constants and the time constants of the detector.

Another instrument available for measuring the rise/fall time and pulse width is a very high speed digitizer. In order to achieve the desired accuracy (measurement of the parameters within 10 nanosec), the sampling rate should be at least 250 megahertz, requiring an expensive digitizer and not practical for portable applications.

An object of this invention is to provide a RF pulse parameter measurement technique using low cost commercial-off-the-shelf test equipment that can operate on RF pulses directly without the use of a detector.

Another object of this invention is to measure the rise time, fall time, and pulse width of RF pulses with a high degree of accuracy (within 10 nanosec), preferably in real-time or near real-time, using only the RF output of the unit-under-test ("UUT") as the input to the invention.

An advantage of the invention is the accuracy of measuring the cited parameters.

Another advantage of the invention is the ability to measure RF pulses directly without the need of a RF detector to digitize the RF pulses.

A further advantage of the invention is its cost effectiveness. The invention uses standard assets such as an RF frequency down converter, a digitizer (100 megahertz) and a digital signal processor. This equipment is common to many other types of measurements (e.g. frequency) required for testing radar or ECM systems, so that the cost can be shared among these measurements. Significantly, the use of a 100 megahertz digitizer, as opposed to 250 megahertz or higher, to achieve the desired accuracy, reduces the cost of the data acquisition hardware. Furthermore, the invention only requires short data acquisition times (typically 200 pulses), thereby allowing efficient execution.

SUMMARY OF THE INVENTION

The present invention is a real-time method that is able to measure the rise/fall time and pulse width of a RF pulse down to 100 nanoseconds in width with very high accuracy (less than 10 nanosec.) at RF signal frequencies up to 40 gigahertz.

According to the present invention, the foregoing and other objects are attained by using multi-purpose, commercial-off-the-shelf test devices, such as an RF signal down converter, a digitizer and a signal processor. The method for measuring the aforementioned parameters comprises the steps of mixing the RF signal with a control frequency, providing an intermediate frequency (IF) signal at a frequency that is the difference between the RF frequency and the control frequency, filtering and then digitizing the signal. An averaging algorithm is applied to a collection of digitized pulses to develop an approximate sample pulse envelope. A measurement algorithm is then applied to the pulse envelope which includes extracting and baseline and plateau data and determining 10 percent, 50 percent and 90 percent levels of the rising/falling edge of the pulse envelope.

Additional objects, advantages and novel features of the invention will be set forth in part in the description which follows, and in part will become apparent to those skilled in the art upon examination of the following or may be learned by practice of the invention.

BRIEF DESCRIPTION OF THE DRAWINGS

The above and other objects and advantages of this invention will be apparent on consideration of the following detailed description, taken in conjunction with the accompanying drawings, in which like reference characters refer to like parts throughout, and in which.

DETAILED DESCRIPTION OF THE INVENTION

The following detailed description, which describes only the preferred embodiments of the invention in detail, is understood only to be an illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

Figure 1:
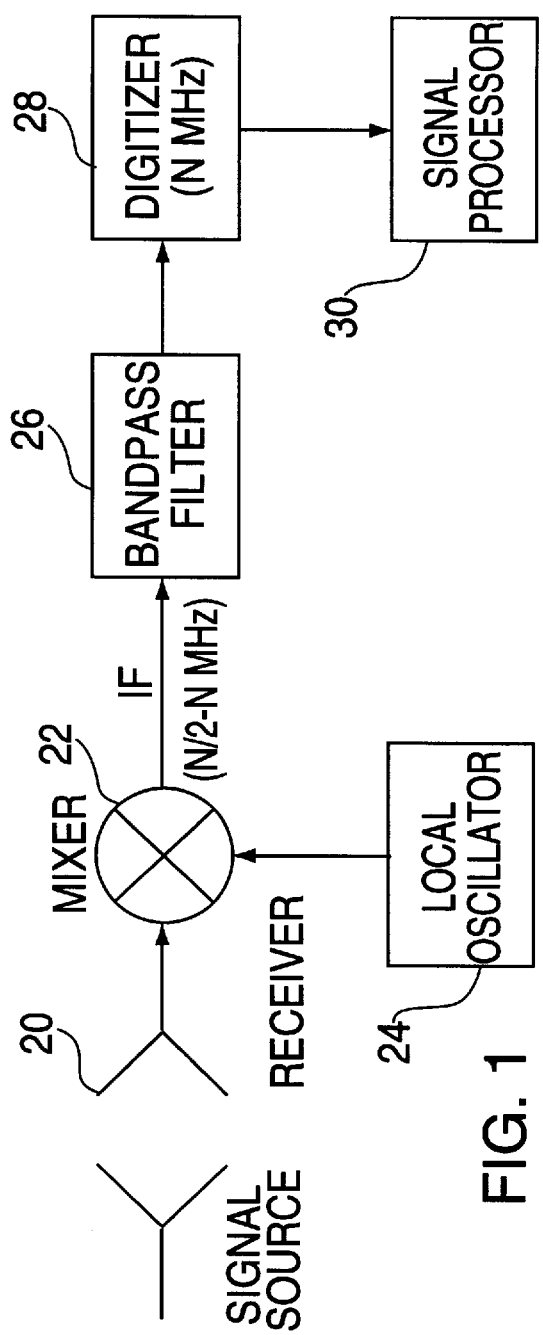
FIG. 1 is a block diagram of the RF pulse signal acquisition procedure.

FIG. 1 illustrates the signal acquisition mechanism of the present invention. The input pulses generated by the UUT are frequency down converted to a pulse stream having an intermediate frequency (IF). Mixer 22 receives the test RF signal from source 20 and a control frequency generated by a local oscillator 24 and outputs an IF signal as the difference between their frequencies (e.g. $Frequency_{RF} - Frequency_{control} = IF$). The IF signal passes through bandpass filter 26 to remove unwanted high frequency components. The IF signal is sampled by a digitizer 28 and transferred to a signal processor 30 to perform rise/fall time and pulse width analysis. The preferred IF is set to a value between the Nyquist frequency (one half the sampling frequency) and the sampling frequency of the digitizer. Preferably, the IF is not a rational number so that repetitive acquisitions will result in truly random phases. The trigger level of the digitizer 28 is preferably adjusted to at least 10% of the signal's peak amplitude so that all of the pulses may be captured. In order to improve parameter estimation accuracy, data for at least 200 pulses are acquired sequentially.

Figure 2:
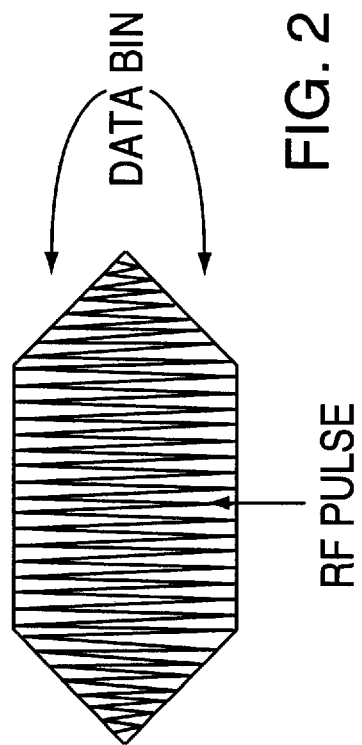
FIG. 2 is a depiction of a data acquisition bin.

The combination of the RF pulse frequency, sample frequency, and trigger level causes a randomness in the phase of the acquired signal relative to the triggering time. Because the sample rate captures between 1 to 2 points per cycle, the average amplitude in each data acquisition bin, illustrated in FIG. 2, over many captured pulses approximates the envelope of a pulse—in essence, performing a detector function. The digital pulse from each data acquisition bin is computed using:

$$\left[\sum_{i=0}^{N-1} \text{abs}(X_i(j))\right]/N$$

where $i$ = Pluse and $j$ = Bin

Figure 3:
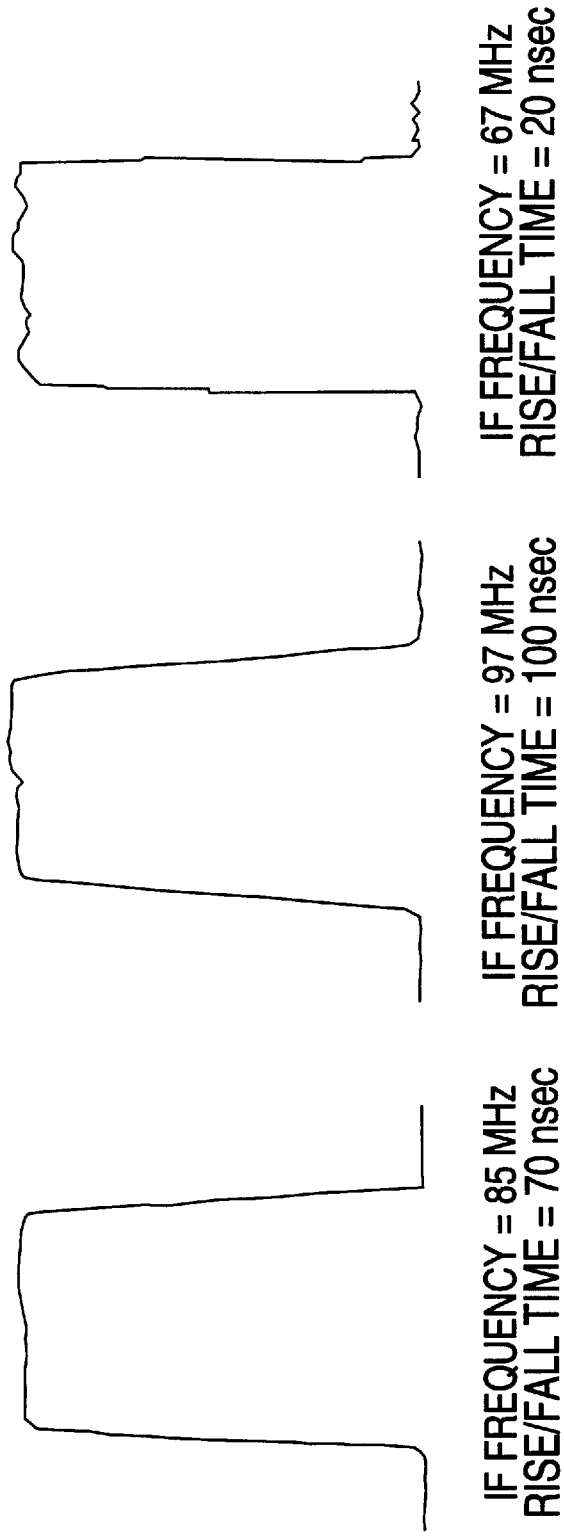
FIG. 3 is a depiction of a digitized RF pulse using varying IF frequencies.

A typical result of the averaging algorithm is shown in FIG. 3. The shape of this waveform (which approximates the pulse envelope) is not dependent on the IF frequency. The practical implication of these results is that the tuning resolution and accuracy of the RF down converter is not critical to measurement accuracy. This fact, in turn, significantly reduces the cost of implementation of the down converter.

Figure 4:
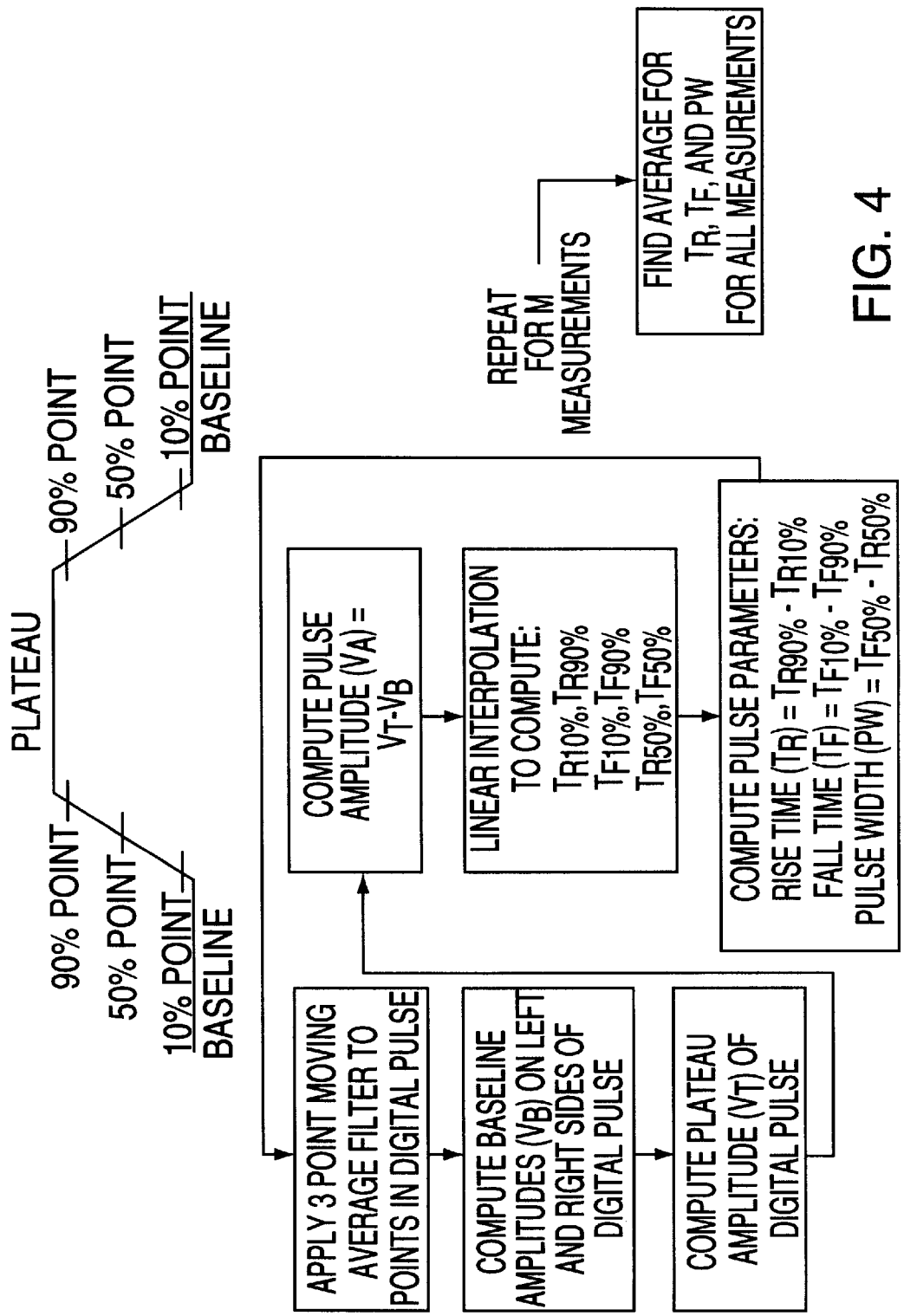
FIG. 4 is a flow diagram of the method for calculating the rise/fall time and pulse width of a RF pulse.

The acquired data of FIG. 3 serves as the input to the rise/fall time and pulse width measurement algorithm, shown in FIG. 4. First, a 3 point moving average filter is applied to points in the digital pulse. To measure the rise/fall time the envelope is scanned to find the baseline before and after the pulse, and the plateau region of the pulse. The amplitude is the difference between the plateau region and the baseline. Using the calculated amplitude and a search technique, known to those skilled in the art, the points before and after the 10 percent and 90 percent levels on the rising/falling edge of the pulse are determined. The exact 10 percent and 90 percent points are then found via linear interpolation. The rise/fall time is the time difference between these two points on the rising/falling edge of the pulse.

The pulse width is determined in a similar fashion by locating the 50 percent points on the rising and falling edges, and subtracting the 50 percent point on the rising edge from the 50 percent point on the falling edge. Accuracy can be improved by repeating this process for as many sets of pulses as desired, and using the average of all the data sets.

The practical importance of the invention will be realized when it is understood that the method described can significantly improve the accuracy of measuring the frequency of narrow pulse widths in a cost efficient manner, in real time and in a noisy environment.

It will be understood that the particular embodiments described above are only illustrative of the principles of the present invention, and that various modifications could be made by those skilled in the art without departing from the scope and spirit of the present invention, which is limited only by the claims that follow.

What is claimed is:

1. A method for measuring pulse characteristics of a pulsed RF signal comprising:

(a) down converting said pulsed RF signal to an intermediate pulse stream signal having an intermediate frequency;

(b) sampling said down converted signal over a selected number of cycles at a selected sampling frequency such that the intermediate frequency is greater than 50% of the sampling frequency, but less than the sampling frequency whereby the sampling collects a data set comprising one or two data points per cycle of the intermediate frequency wherein said data set represents a single pulse;

(c) collecting multiple data sets;

(d) collecting within each of said data sets, data points before, during and after each pulse;

(e) averaging said data sets to obtain a sample pulse envelope comprising baseline points, a rising edge, a pulse plateau and a falling edge; and (f) calculating one or more of said pulse characteristics consisting of rise time, fall time and pulse width.

2. The method of claim 1 wherein step (f) comprises the steps:

(a) calculating the time associated with the data points representing 10 percent of the rising edge above said baseline point;

(b) calculating the time associated with the data points representing 90 percent of the rising edge above said baseline point; and (c) calculating said rise time by subtracting the time associated with said rising edge 10 percent level from the time associated with said rising edge 90 percent level.

3. The method of claim 1 wherein step (f) comprises the steps:

(a) calculating the time associated with the data points representing 10 percent of the falling edge above said baseline point;

(b) calculating the time associated with the data points representing 90 percent of the falling edge above said baseline point; and (c) calculating said fall time by subtracting the time associated with said falling edge 10 percent level from the time associated with said falling edge 90 percent level.

4. The method of claim 1 wherein step (f) comprises the steps:

(a) calculating the time associated with the data points representing 50 percent of both the rise edge and fall edge above said baseline point; and (b) calculating said pulse width by subtracting the time associated with said rising edge 50 percent level from the time associated with said falling edge 50 percent level.

* * * * *